US011897009B2

United States Patent
Ueda et al.

(10) Patent No.: US 11,897,009 B2
(45) Date of Patent: Feb. 13, 2024

(54) SUBSTRATE PROCESSING METHOD AND SUBSTRATE PROCESSING DEVICE

(71) Applicant: SCREEN Holdings Co., Ltd., Kyoto (JP)

(72) Inventors: Dai Ueda, Kyoto (JP); Yuta Sasaki, Kyoto (JP); Yosuke Hanawa, Kyoto (JP); Hiroaki Kitagawa, Kyoto (JP)

(73) Assignee: SCREEN Holdings Co., Ltd.

( * ) Notice: Subject to any disclaimer, the term of this patent is extended or adjusted under 35 U.S.C. 154(b) by 774 days.

(21) Appl. No.: 16/981,309

(22) PCT Filed: Feb. 7, 2019

(86) PCT No.: PCT/JP2019/004460
§ 371 (c)(1),
(2) Date: Sep. 16, 2020

(87) PCT Pub. No.: WO2019/187687
PCT Pub. Date: Oct. 3, 2019

(65) Prior Publication Data
US 2021/0016331 A1  Jan. 21, 2021

(30) Foreign Application Priority Data

Mar. 26, 2018  (JP) ................................ 2018-057940

(51) Int. Cl.
*H01L 21/304* (2006.01)
*B08B 3/10* (2006.01)
*F26B 5/10* (2006.01)

(52) U.S. Cl.
CPC .................. *B08B 3/10* (2013.01); *F26B 5/10* (2013.01); *H01L 21/304* (2013.01)

(58) Field of Classification Search
None
See application file for complete search history.

(56) References Cited

U.S. PATENT DOCUMENTS

2007/0199891 A1   8/2007  Mabuchi et al. ........ 210/500.23
2012/0073599 A1*  3/2012  Miya ................. H01L 21/67034
                                                      134/4
(Continued)

FOREIGN PATENT DOCUMENTS

JP        H11-031673 A      2/1999
JP        2010-199261 A     9/2010
(Continued)

OTHER PUBLICATIONS

International Search Report dated Apr. 2, 2019 in corresponding PCT International Application No. PCT/JP2019/004460.

(Continued)

*Primary Examiner* — Cristi J Tate-Sims
(74) *Attorney, Agent, or Firm* — OSTROLENK FABER LLP (57) ABSTRACT

A substrate processing technique including a process of forming a liquid film on an upper surface of a substrate and excellently solidifying the liquid film is provided. A substrate processing method includes an atmosphere control step of supplying a drying gas to a front surface of a substrate on which a pattern has been formed and to which a liquid has adhered and making a dry atmosphere around the front surface of the substrate, a to-be-solidified liquid supplying step of supplying a to-be-solidified liquid to the front surface of the substrate, and a solidification step of forming a solidified mass by solidifying a liquid film of the to-be-solidified liquid. The atmosphere control step is started before the liquid film of the to-be-solidified liquid supplied to the front surface of the substrate in the to-be-solidified liquid supplying step is formed.

10 Claims, 5 Drawing Sheets

(56) References Cited

U.S. PATENT DOCUMENTS

| | | | |
|---|---|---|---|
| 2012/0175819 A1 | 7/2012 | Miya et al. | 264/334 |
| 2012/0186275 A1 | 7/2012 | Kato et al. | 62/64 |
| 2014/0101964 A1 | 4/2014 | Sirard et al. | 34/284 |
| 2016/0059274 A1* | 3/2016 | Miya | B08B 3/10 |
| | | | 134/198 |
| 2016/0279679 A1 | 9/2016 | Kitagawa et al. | |
| 2017/0213725 A1 | 7/2017 | Kitagawa et al. | |
| 2017/0345683 A1 | 11/2017 | Sasaki et al. | |

FOREIGN PATENT DOCUMENTS

| | | | |
|---|---|---|---|
| JP | 2012-054373 A | 3/2012 | |
| JP | 2012-160682 A | 8/2012 | |
| JP | 2014-090167 A | 5/2014 | |
| JP | 2015-142069 A | 8/2015 | |
| JP | 2015-228395 A | 12/2015 | |
| JP | 2018-022861 A | 2/2018 | |
| TW | 201230177 A | 7/2012 | |
| TW | 201236052 A | 9/2012 | |
| TW | 201703884 A | 2/2017 | |
| TW | 201727813 A | 8/2017 | |

OTHER PUBLICATIONS

Written Opinion dated Apr. 2, 2019 in corresponding PCT International Application No. PCT/JP2019/004460.

International Preliminary Report on Patentability (Chapter I of the Patent Cooperation Treaty) dated Oct. 8, 2020 with Notification from the International Bureau (Form PCT/IB/326) in corresponding PCT International Application No. PCT/JP2019/004460 in Japanese.

English translation of the International Preliminary Report on Patentability (Chapter I of the Patent Cooperation Treaty) dated Oct. 8, 2020 with Notification from the International Bureau (Form PCT/IB/338) in corresponding PCT International Application No. PCT/JP2019/004460 in English.

* cited by examiner

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of International Application No. PCT/JP2019/004460, filed Feb. 7, 2019, which claims priority to Japanese Patent Application No. 2018-057940, filed Mar. 26, 2018, the contents of both of which are incorporated herein by reference. The PCT International Application was published in the Japanese language.

TECHNICAL FIELD

The present application claims priority based on Japanese Patent Application No. 2018-57940 filed in the Japan Patent Office on Mar. 26, 2018, the entire disclosure of which is incorporated herein by reference.

The present invention relates to a substrate processing method and a substrate processing apparatus in each of which a liquid film is formed on a front surface of a substrate, and then the liquid film is solidified. Examples of substrates to be processed include various substrates, i.e., include semiconductor substrates, glass substrates for photomasks, glass substrates for liquid crystal displays, glass substrates for plasma displays, substrates for FPDs (Flat Panel Displays) such as liquid crystal displays or organic EL (Electroluminescence) displays, substrates for optical disks, substrates for magnetic disks, substrates for magneto-optical disks, etc.

BACKGROUND ART

Heretofore, a technique for solidifying a liquid film by cooling a substrate in a state in which the liquid film has adhered to a substrate surface of the substrate has been known as one substrate-processing procedure. Particularly, this technique has been used as one substrate-cleaning and substrate-drying treatment. In other words, with the miniaturization, advanced functionalization, and high accurateness of devices whose typical example is a semiconductor device, it has become increasingly difficult to remove micro contaminants, such as particles that adhere to a substrate surface and to dry the substrate surface without collapsing a pattern formed on the substrate surface. Therefore, freezing-cleaning treatment in which particles adhering to a substrate surface are removed by use of the aforementioned technique (see Patent Literature 1) or drying treatment in which a processing liquid adhering to a substrate is dried through a wet process by use of the aforementioned technique (see Patent Literature 2) has been proposed.

In the freezing-cleaning treatment, a liquid film is formed on a substrate surface of a substrate while supplying a cleaning liquid to the substrate surface. Thereafter, the liquid film is solidified (frozen) by cooling the substrate. Hence, a solidified film is generated on the substrate surface to which particles have adhered. Lastly, the solidified film is removed from the substrate surface, thus making it possible to remove the particles from the substrate surface together with the solidified film. For example, in a device described in Patent Literature 1, a liquid film is formed by supplying pure water to a substrate surface, and is then solidified (frozen).

The drying treatment is performed to remove a rinse liquid and to dry a substrate surface after the substrate surface is rinsed. In a rinsing process, a rinse liquid, such as deionized water (DIW), is supplied to the substrate surface to which a cleaning liquid has adhered, and the cleaning liquid on the substrate surface is removed. Thereafter, a drying-treatment liquid is supplied to the substrate surface, and a liquid film of the drying-treatment liquid is formed on the substrate surface while removing the rinse liquid existing on the substrate surface. Thereafter, the liquid film is solidified by cooling the substrate, and a solidified film is formed. The drying treatment is performed for drying the substrate surface by removing the solidified film while changing it into a vapor phase without undergoing a liquid phase. For example, in a drying method described in Patent Literature 2, a liquid film is formed while supplying a processing liquid including a sublimable substance (t-butanol) to the substrate surface, and a solidified film is formed by cooling the liquid film, and is sublimed. The drying method performed in this way is capable of reducing the action of surface tension on a pattern formed on the substrate surface, hence making it possible to restrain or prevent the collapse of the pattern.

CITATION LIST

Patent Literature

Patent Literature 1: Japanese Patent Application Publication No. 11-31673
Patent Literature 2: Japanese Patent Application Publication No. 2015-142069

SUMMARY OF INVENTION

Technical Problem

In the aforementioned conventional technique, a cooled gas, which has been cooled to become equal to or less than a solidification point of the to-be-solidified liquid, is supplied in order to solidify a liquid film of each processing liquid (each to-be-solidified liquid). However, some to-be-solidified liquids absorb moisture in an atmosphere of a substrate surface or moisture remaining on a substrate surface in a rinsing step or the like, and, as a result, a solidification point depression is caused, and the solidification point falls significantly. A fall in the solidification point depends on the amount of moisture that has been absorbed, and therefore its depressed temperature is unpredictable. Therefore, it is impossible to appropriately determine the temperature of a cooling gas necessary to solidify the to-be-solidified liquid. If the temperature of the cooling gas is equal to or higher than a solidification point that has fallen because of the solidification point depression, it is impossible to excellently solidify the entirety of the liquid film. Because of this, disadvantageously, particles cannot be removed, or a pattern collapse will occur.

Additionally, processing cost and energy consumption will be uselessly imposed although it is possible to solidify the entirety of the liquid film if the temperature of the cooling gas is set at an extremely low value in order to solve the aforementioned problems.

A preferred embodiment of the present invention provides a substrate processing method and a substrate processing apparatus each of which is capable of excellently solidifying a liquid film on a substrate and hence is capable of performing excellent substrate processing.

Solution to Problem

One preferred embodiment of the present invention provides a substrate processing method that includes an atmosphere control step of supplying a drying gas to a front surface of a substrate on which a pattern has been formed and making a dry atmosphere around the front surface of the substrate, a to-be-solidified liquid supplying step of supplying a to-be-solidified liquid to the front surface of the substrate in which a dry atmosphere has been made by the atmosphere control step, and a solidification step of forming a solidified mass by solidifying the to-be-solidified liquid.

Additionally, one preferred embodiment of the present invention provides a substrate processing apparatus that includes a substrate holding portion that rotates while holding a substrate, a first gas supply means for supplying a drying gas to a front surface of the substrate held by the substrate holding portion, a to-be-solidified liquid supply means for supplying a to-be-solidified liquid to the front surface of the substrate held by the substrate holding portion, and a second gas supply means for supplying a cooling gas to solidify the to-be-solidified liquid, in which the to-be-solidified liquid is supplied in a state in which a dry atmosphere has been made around the front surface of the substrate.

According to the aforementioned substrate processing method or substrate processing apparatus, the atmosphere around the front surface of the substrate is replaced with a dry atmosphere before forming a liquid film of the to-be-solidified liquid on the front surface of the substrate. This makes it possible to restrict or prevent the solidification point depression of the to-be-solidified liquid that is caused by the fact that the liquid film of the to-be-solidified liquid formed on the front surface of the substrate absorbs moisture in the atmosphere around the front surface of the substrate, hence making it possible to excellently solidify the liquid film on the substrate. Therefore, it is possible to excellently perform substrate processing. The aforementioned or still other objects, features, and effects of the present invention will be clarified by the following description of preferred embodiments given below with reference to the accompanying drawings.

DESCRIPTION OF EMBODIMENTS

A substrate processing apparatus to which the present invention is applicable will be broadly described hereinafter. In the following description, the term "substrate" denotes any one of various substrates, i.e., semiconductor substrates, glass substrates for photomasks, glass substrates for liquid crystal displays, glass substrates for plasma displays, substrates for FPDs (Flat Panel Displays) such as liquid crystal displays or organic EL (Electroluminescence) displays, substrates for optical disks, substrates for magnetic disks, substrates for magneto-optical disks, etc. Hereinafter, a substrate processing apparatus that is used to process a semiconductor substrate is taken as an example, and is chiefly described with reference to the drawings, and yet the present invention is applicable also for processing the aforementioned various substrates.

Additionally, a substrate that has a circuit pattern, etc., (hereinafter referred to as a "pattern") formed on only one principal surface is taken as an example of the substrate. Here, a principal surface on which a pattern has been formed is referred to as a "pattern formation surface" or a "front surface," and a principal surface on which a pattern has not been formed on an opposite side is referred to as a "rear surface." Additionally, a principal surface of a substrate directed downwardly is referred to as a "lower surface," and a principal surface of a substrate directed upwardly is referred to as an "upper surface." An example in which an upper surface is a front surface will be described hereinafter.

A substrate processing apparatus 1 is a single substrate processing type apparatus that is used for cleaning treatment that is performed to remove contaminants such as particles adhering to a substrate W and drying treatment after finishing the cleaning treatment.

First Preferred Embodiment

Figure 1:
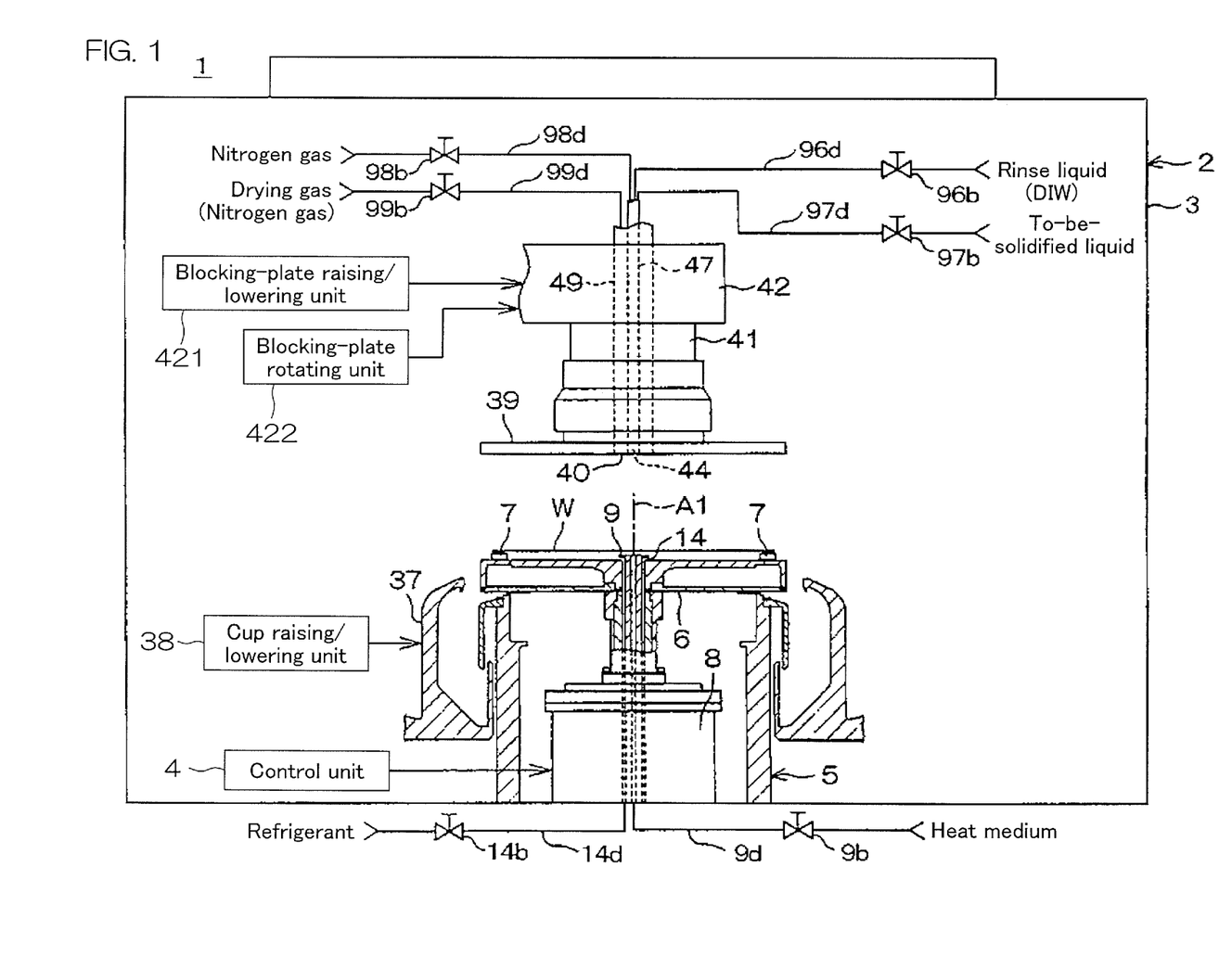
FIG. 1 is a view showing a preferred embodiment of a substrate processing apparatus according to the present invention.
Figure 2:
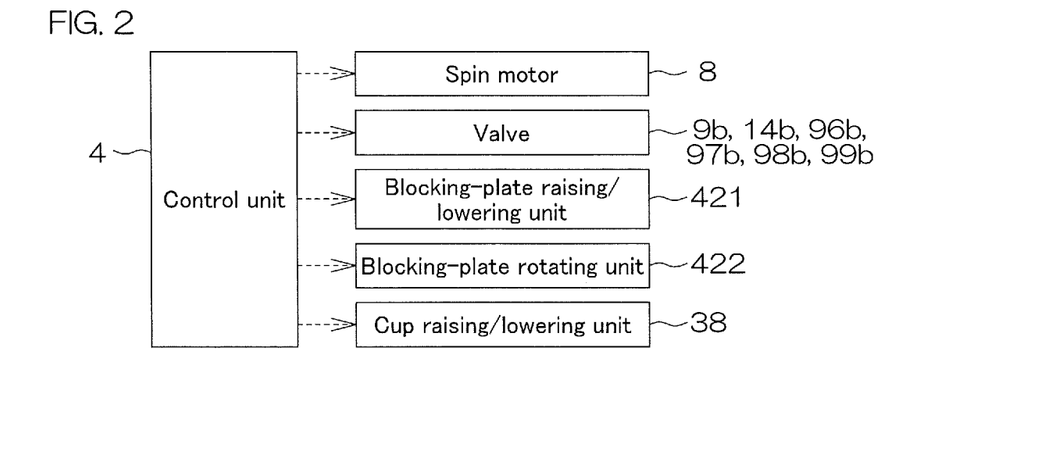
FIG. 2 is a block diagram showing a main control configuration of the substrate processing apparatus of FIG. 1.

FIG. 1 is a schematic front view showing a preferred embodiment of a substrate processing apparatus according to the present invention. Additionally, FIG. 2 is a block diagram showing a main control configuration of the substrate processing apparatus of FIG. 1. This substrate processing apparatus 1 is a single substrate processing type apparatus that processes disk-shaped substrates W, such as semiconductor wafers, one by one. Although a description is given while taking drying treatment as an example in the present preferred embodiment, the present invention is applicable in cleaning treatment or in other process steps of solidifying liquid films without being limited to drying treatment.

The substrate processing apparatus 1 includes a processing unit 2 that houses the substrate W and that performs various processes and a control unit (controller) 4 that controls the entirety of the apparatus.

The processing unit 2 is a single substrate processing type unit that processes a plurality of substrates W one by one by use of a processing liquid. The processing unit 2 includes a box-shaped chamber 3 having an internal space and a spin chuck 5 that rotates a substrate W around a vertical rotational axis A1 passing through a central portion of the substrate W while holding the single substrate W in a horizontal attitude in the chamber 3. The processing unit 2 additionally includes a cup 37 that surrounds the spin chuck 5 around the rotational axis A1 and a disk-shaped blocking plate 39 that is disposed in a horizontal attitude above the spin chuck 5.

The spin chuck 5 includes a disk-shaped spin base 6 that is held in a horizontal attitude, a plurality of chuck pins 7 that protrude upwardly from an outer peripheral portion of an upper surface of the spin base 6, and a spin motor 8 that rotates the spin base 6 and the plurality of chuck pins 7 around the rotational axis A1. The chuck pins 7 are movable with respect to the spin base 6 between a closed position at which the plurality of chuck pins 7 horizontally hold the substrate W above the spin base 6 and an open position at which the substrate W is released from being held by the plurality of chuck pins 7. The spin chuck 5 includes a chuck opening/closing mechanism that moves the plurality of chuck pins 7 between the closed position and the open position, although not shown.

The blocking plate 39 includes a rotation support shaft 41 that supports the blocking plate 39, an outer insertion tube 49 inserted in the rotation support shaft 41, and an inner insertion tube 47 inserted in the outer insertion tube 49. The blocking plate 39 is supported in a horizontal attitude by means of the rotation support shaft 41 that extends in an up-down direction along the rotational axis A1. A center line of the blocking plate 39 is disposed on the rotational axis A1. The blocking plate 39 includes a circular lower surface (facing surface) whose outer diameter is larger than the diameter of the substrate W and a downward discharge port 40 that is opened at a central portion of the lower surface of the blocking plate 39. The blocking plate 39 is disposed below the rotation support shaft 41. The rotation support shaft 41 is supported rotatably around the rotational axis A1 passing through a center of the substrate W by means of a support arm 42 horizontally extending above the blocking plate 39. A bearing (not shown) is interposed and attached between an inner peripheral surface of the rotation support shaft 41 and an outer peripheral surface of the outer insertion tube 49. A blocking-plate raising/lowering unit 421 and a blocking-plate rotating unit 422 are connected to the support arm 42.

The blocking-plate raising/lowering unit 421 is capable of placing the blocking plate 39 at an arbitrary position (height) by bringing the blocking plate 39 closer to the spin base 6 so that the blocking plate 39 faces the spin base 6 or by allowing the blocking plate 39 to recede from the spin base 6 in an opposite manner. In detail, the control unit 4 raises the blocking plate 39 to a receded position placed above the spin chuck 5 by actuating the blocking-plate raising/lowering unit 421 when the substrate W is carried into or carried out from the processing unit 2. On the other hand, the control unit 4 lowers the blocking plate 39 to a predetermined facing position (position shown in FIG. 1) that is set so as to become very close to a front surface Wf of the substrate W held by the spin chuck 5 when predetermined treatment is applied to the substrate W. In the present preferred embodiment, the control unit 4 lowers the blocking plate 39 from the receded position to the facing position simultaneously with the start of the supply of a rinse liquid to the front surface Wf of the substrate W, and the control unit 4 continuously places the blocking plate 39 at the facing position until drying treatment is finished. However, the raising/lowering timing of the blocking plate 39 is not limited to the aforementioned timing. For example, the raising/lowering timing may be set so as to be after the supply of a rinse liquid is completed and before the supply of a to-be-solidified liquid is started.

The blocking-plate rotating unit 422 rotates the rotation support shaft 41 around the rotational axis A1. The blocking plate 39 rotates together with the rotation support shaft 41 when the rotation support shaft 41 is rotated. The blocking-plate rotating unit 422 is configured to rotate the blocking plate 39 in the same rotation direction as the substrate W and at substantially the same rotation speed in accordance with the rotation of the substrate W held by the spin chuck 5.

Figure 3:
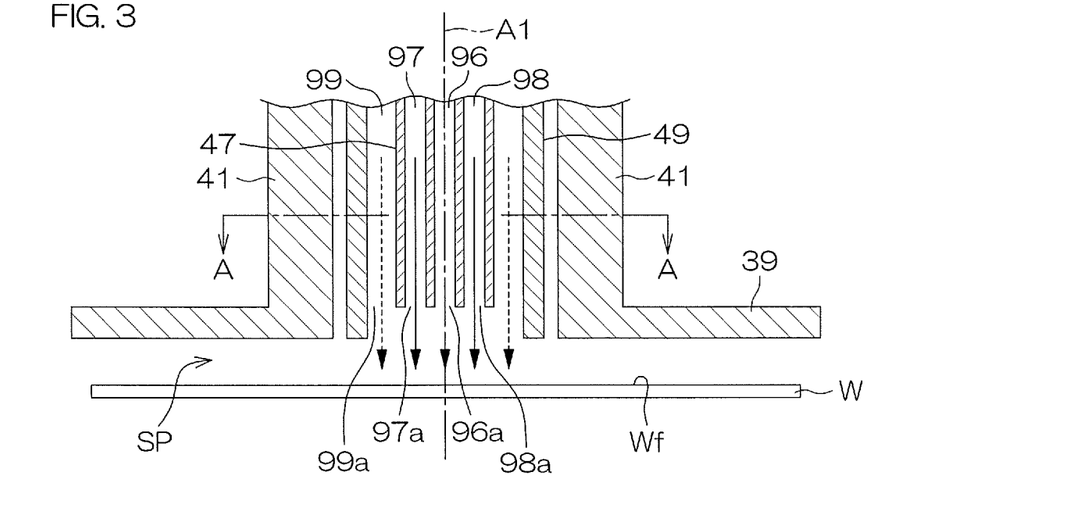
FIG. 3 is an illustrative longitudinal sectional view showing a main portion of a blocking plate mounted in the substrate processing apparatus of FIG. 1.
Figure 4:
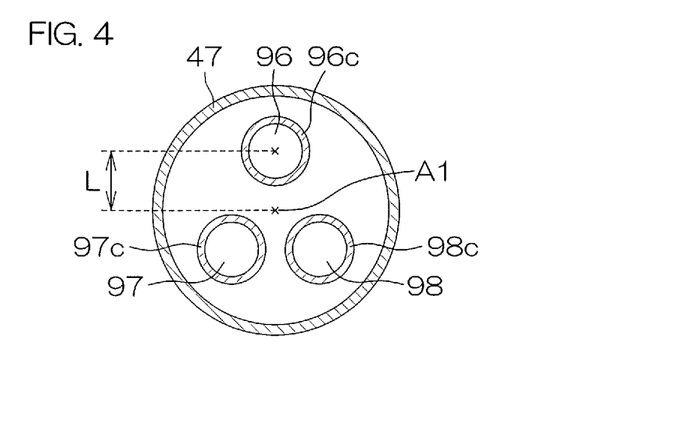
FIG. 4 is a cross-sectional view (transverse sectional view) along line A-A' of FIG. 3.

FIG. 3 is an illustrative longitudinal sectional view showing a main portion of the blocking plate mounted in the substrate processing apparatus 1 of FIG. 1. Additionally, FIG. 4 is a cross-sectional view (transverse sectional view) along line A-A' of FIG. 3, and shows a more detailed structure example of the inner insertion tube 47. The outer insertion tube 49 whose transverse plane is circularly formed is inserted in the rotation support shaft 41. The inner insertion tube 47 is inserted in a hollow portion of the outer insertion tube 49. The inner insertion tube 47 has a transverse plane formed circularly. Three fluid supply passages that extend in a vertical axis direction are formed in the inner insertion tube 47. In other words, a rinse liquid supply passage 96 that serves as a passage of a rinse liquid, a to-be-solidified liquid supply passage 97 that serves as a passage of a to-be-solidified liquid, and a first gas supply passage 98 that serves as a passage of an inert gas, such as nitrogen gas, are formed in the inner insertion tube 47 as illustratively shown in FIG. 3. In detail, the rinse liquid supply passage 96, the to-be-solidified liquid supply passage 97, and the first gas supply passage 98 may be formed of tubes 96c, 97c, and 98c that are inserted in the axial direction of the inner insertion tube 47, respectively, as shown in FIG. 4. The inner insertion tube 47 is made of, for example, PTFE (polytetrafluoroethylene). The tubes 96c, 97c, and 98c are made of, for example, PFA (polymer of tetrafluoroethylene and perfluoroalkylvinylether).

An upper end of the rinse liquid supply passage 96, an upper end of the to-be-solidified liquid supply passage 97, and an upper end of the first gas supply passage 98 lead to a rinse liquid supply pipe 96d, a to-be-solidified liquid supply pipe 97d, and a first gas supply pipe 98d that are shown in FIG. 1, respectively. A valve 96b, a valve 97b, and a valve 98b are interposed in the rinse liquid supply pipe 96d, the to-be-solidified liquid supply pipe 97d, and the first gas supply pipe 98d, respectively.

A lower end of the rinse liquid supply passage 96, a lower end of the to-be-solidified liquid supply passage 97, and a lower end of the first gas supply passage 98 are a rinse liquid discharge port 96a, a to-be-solidified liquid discharge port 97a, and a first gas discharge port 98a, respectively, as shown in FIG. 3, and these discharge ports face the front surface Wf of the substrate W held by the spin chuck 5. The diameter of the inner insertion tube 47 is 18 mm to 20 mm in the present preferred embodiment. Additionally, the port diameter of each of the rinse liquid discharge port 96a, the to-be-solidified liquid discharge port 97a, and the first gas discharge port 98a is 4 mm.

The rinse liquid discharge port 96a is disposed at a position that deviates from a central axis of the blocking plate 39, i.e., from the rotational axis A1 of the substrate W outwardly in a radial direction in the present preferred embodiment. This allows DIW discharged from the rinse liquid discharge port 96a to avoid being concentratedly supplied to one point (a rotational center of the substrate W) of the front surface Wf of the substrate W. As a result, it becomes possible to disperse an electrically-charged part of the front surface Wf of the substrate W, and it becomes possible to reduce oxidation caused by the electric charge of the substrate W. On the other hand, if the rinse liquid discharge port 96a excessively recedes from the rotational axis A1, it becomes difficult to allow a rinse liquid to reach the rotational center located on the front surface Wf of the substrate W. Therefore, a distance L from the rotational axis A1 to the rinse liquid discharge port 96a (center of the discharge port) in the horizontal direction is set at about 4 mm in the present preferred embodiment. An example of an upper limit value of the distance L that enables DIW to be supplied to the rotational center located on the front surface Wf of the substrate W is 20 mm under the following conditions.

Flow rate of DIW: 2 L/min
Rotational speed of substrate: 1500 rpm
State of front surface of substrate: Hydrophobic surface in central portion of front surface of substrate An upper limit value of the distance from the rotational axis A1 to the to-be-solidified liquid discharge port 97a (center of the discharge port) is fundamentally the same as the upper limit value (20 mm) of the distance L from the rotational axis A1 to the rinse liquid discharge port 96a (center of the discharge port) as long as the rotational speed of the substrate is set at 1500 rpm.

On the other hand, the distance from the rotational axis A1 to the first gas discharge port 98a (center of the discharge port) is arbitrary without being specifically limited as long as a nitrogen gas is supplied to a gap space SP formed between the blocking plate 39 positioned at the facing position and the front surface Wf of the substrate W. However, it is preferable to dispose the first gas discharge port 98a on the rotational axis A1 or near the rotational axis A1 from the viewpoint of forming a solidified film by spraying a nitrogen gas onto a liquid film of a to-be-solidified liquid formed on the front surface Wf of the substrate W in such a way as described later.

A space formed between an inner wall surface of the outer insertion tube 49 and an outer wall surface of the inner insertion tube 47 defines a second gas supply passage 99. An upper end of the second gas supply passage 99 leads to a second gas supply pipe 99d shown in FIG. 1. A valve 99b is interposed in the second gas supply pipe 99d. A lower end of the second gas supply passage 99 serves as an annular second gas discharge port 99a. In other words, the blocking plate 39 is provided with the second gas discharge port 99a besides the first gas discharge port 98a through which an inert gas is discharged toward a central portion of the front surface Wf of the substrate W. The second gas discharge port 99a is disposed outside in the radial direction with respect to the rinse liquid discharge port 96a, the to-be-solidified liquid discharge port 97a, and the first gas discharge port 98a, and is disposed so as to surround the rinse liquid discharge port 96a, the to-be-solidified liquid discharge port 97a, and the first gas discharge port 98a. The opening area of the second gas discharge port 99a is conspicuously larger than the opening area of the first gas discharge port 98a.

As thus described, the two kinds of gas discharge ports are provided at the blocking plate 39, and therefore it is possible to discharge inert gases, which differ from each other in flow rate and in flow speed, from each discharge port. For example, (1) in order to keep an atmosphere around the front surface Wf of the substrate W in an inert gas atmosphere, it is desired to supply an inert gas in a comparatively large flow rate and at a low speed so as not to blow off a liquid existing on the front surface Wf of the substrate W. On the other hand, (2) when forming a solidified film of a liquid film of a to-be-solidified liquid existing on the front surface Wf of the substrate W, it is desired to supply an inert gas to the central portion of the front surface of the substrate W in a comparatively small flow rate and at a high speed. Therefore, in the case (1) mentioned above, the inert gas is discharged chiefly from the second gas discharge port 99a, and, in the case (2) mentioned above, the inert gas is discharged chiefly from the first gas discharge port 98a, thus making it possible to supply the inert gas to the front surface Wf of the substrate W in an appropriate flow rate and at an appropriate flow speed in accordance with the purpose of use of the inert gas.

Referring back to FIG. 1, the description will be continuously given. The processing unit 2 includes a heat medium supply nozzle 9 that discharges a heat medium toward a central portion of the lower surface of the substrate W, a heat medium supply pipe 9d that guides a heat medium to the heat medium supply nozzle 9, a valve 9b interposed in the heat medium supply pipe 9d, and a heater (not shown) that raises the temperature of a heat medium up to a temperature higher than the solidification point of a to-be-solidified liquid.

The processing unit 2 additionally includes a refrigerant supply nozzle 14 that discharges a refrigerant toward the central portion of the lower surface of the substrate W, a refrigerant supply pipe 14d that guides a refrigerant to the refrigerant supply nozzle 14, a valve 14b interposed in the refrigerant supply pipe 14d, and a cooler (not shown) that lowers the temperature of a refrigerant to a temperature lower than the solidification point of a to-be-solidified liquid.

The cup 37 can be raised and lowered in the vertical direction between an upper position and a lower position. The upper position is a processing position at which an upper end of the cup 37 is placed above a position at which the substrate W is held by the spin chuck 5. The lower position is a retreat position (position shown in FIG. 1) at which the upper end of the cup 37 is placed below a position at which the substrate W is held by the spin chuck 5. The processing unit 2 includes a cup raising/lowering unit 38 that raises and lowers the cup 37 between the upper position and the lower position. In a state in which the cup 37 is placed at the upper position, each processing liquid discharged from the substrate W to its surroundings is received by the cup 37, and is collected in the cup 37. Thereafter, each processing liquid collected in the cup 37 is recovered or discarded.

Figure 5:
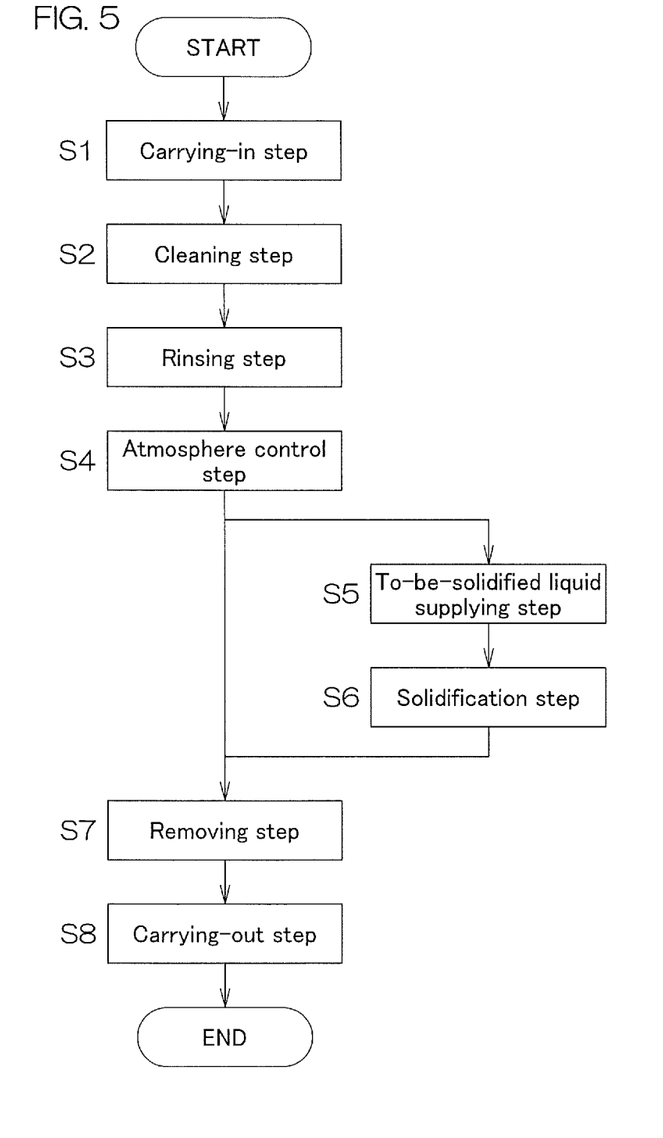
FIG. 5 is a flowchart showing an example of a substrate processing method that uses the substrate processing apparatus of FIG. 1.

Next, operations of the substrate processing apparatus 1 configured as above will be described in detail with reference to FIG. 5 and FIG. 6A to FIG. 6E. FIG. 5 is a flowchart showing an example of operations (drying treatment) of the substrate processing apparatus 1. FIG. 6A to FIG. 6E are schematic views, each showing an operation of the substrate processing apparatus 1 and a state of the substrate W in each step of FIG. 5.

First, an execution command of a predetermined substrate processing program according to the substrate W is issued by an operator. Thereafter, a carrying-in step (step S1 of FIG. 5) of carrying the substrate W into the processing unit 2 is performed. In detail, the control unit 4 controls a transfer robot so that the substrate W held by a hand of the transfer robot is placed on the plurality of chuck pins 7 in a state in which the blocking plate 39, etc., have retreated. After the substrate W is placed on the plurality of chuck pins 7, the control unit 4 further allows the plurality of chuck pins 7 to grasp the substrate W, and allows the hand of the transfer robot to retreat from the inside of the chamber 3.

Next, a cleaning step (step S2 of FIG. 5) through a wet cleaning means, not shown, is performed. For example, SC-1 (liquid that contains ammonia, hydrogen peroxide water, and water), SC-2 (liquid that contains hydrochloric acid, hydrogen peroxide water, and water), etc., can be mentioned as a cleaning liquid without being specifically limited. The amount of supply of the cleaning liquid can be appropriately set in accordance with a cleaning range, etc., without being specifically limited. Likewise, cleaning time can be appropriately set as necessary without being specifically limited.

Next, a rinsing step (step S3 of FIG. 5) of supplying DIW to the front surface Wf of the substrate W to which a cleaning liquid has adhered is performed. In detail, the control unit 4 allows the spin motor 8 to start the rotation of the substrate W so that the substrate W rotates at a liquid processing speed (for example, 800 rpm). Thereafter, the control unit 4 opens the valve 96b, and allows the rinse liquid discharge port 96a of the blocking plate 39 placed at the receded position to start the discharge of DIW as a rinse liquid through the rinse liquid supply pipe 96d. DIW that has been supplied to the front surface Wf of the substrate W flows from the vicinity of the center of the front surface Wf of the substrate W toward a peripheral edge portion of the substrate W by means of a centrifugal force caused by the rotation of the substrate W, and diffuses to the entirety of the front surface Wf of the substrate W. Hence, the cleaning liquid adhering to the front surface Wf of the substrate W is removed by the supply of DIW, and the entirety of the front surface Wf of the substrate W is covered with DIW. The rinse liquid can be appropriately changed without being limited to DIW. Additionally, the rotation speed of the substrate W can be appropriately set without being limited to the aforementioned speed at such a degree that the film thickness of the film made of DIW becomes larger than the height of a protruded pattern portion formed on the front surface Wf in the entirety of the front surface Wf.

Additionally, a blocking-plate approaching step is performed simultaneously with the rinsing step (not shown). In detail, the control unit 4 controls the blocking-plate raising/lowering unit 421 so that the blocking plate 39 is lowered toward the facing position of the front surface Wf of the substrate W and is positioned at the facing position (proximal position). At this time, the distance between the front surface Wf of the substrate W and the blocking plate 39 is about 1 mm to 10 mm, and preferably 3 mm. Hence, the front surface Wf of the substrate W is covered in a state in which it has proximally approached a substrate facing surface of the blocking plate 39, and is blocked from an atmosphere around the substrate W. Without being limited to the aforementioned timing, the blocking-plate approaching step may be performed at any timing if it is before the start of an atmosphere control step described later.

When a predetermined time elapses after the valve 96b is opened, the control unit 4 closes the valve 96b, and ends the discharge of DIW from the rinse liquid discharge port 96a, and the rinsing step is ended. It should be noted that the predetermined time is determined by the amount of supply of DIW. The amount of supply of DIW can be appropriately set without being specifically limited.

Figure 6A:
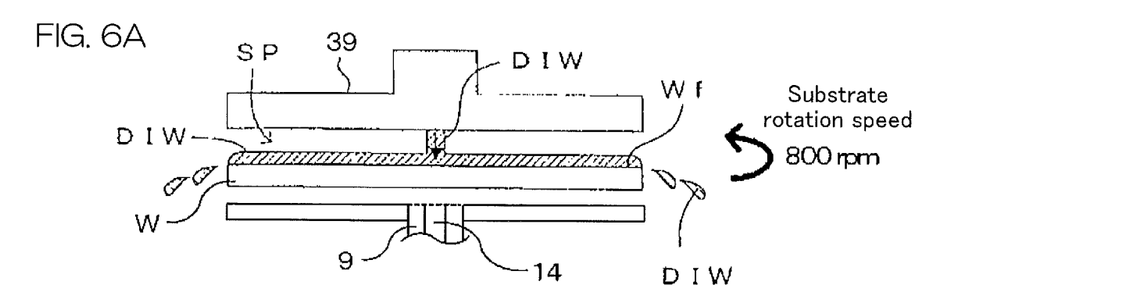
FIG. 6A to FIG. 6E are schematic views, each showing operations of main components and a situation of a substrate in each step of the substrate processing method of FIG. 5.

FIG. 6A shows a processing operation of each component and a situation of the substrate W in a state in which the blocking plate 39 is positioned at the proximal position in the rinsing step. In the front surface Wf of the substrate W, the cleaning liquid is removed by DIW that has been supplied in the rinsing step, and a liquid film of DIW is formed as shown in FIG. 6A.

Next, an atmosphere control step (step S4 of FIG. 5) is performed in which a nitrogen gas as a drying inert gas is supplied to the front surface Wf of the substrate W to which DIW has adhered and in which the surroundings of the front surface Wf of the substrate W are replaced with a dry atmosphere. In detail, the control unit 4 rotates the substrate W and the blocking plate 39 around the rotational axis A1 at a constant speed by controlling the spin motor 8 and the blocking-plate rotating unit 422. Preferably, the rotation speed of the blocking plate 39 and that of the substrate W are set at such a degree that a nitrogen gas flows from the vicinity of the center of the front surface Wf of the substrate W toward a peripheral-edge-portion direction of the substrate W and diffuses to the entirety of the front surface Wf of the substrate W by means of a centrifugal force caused by the rotation of the blocking plate 39 and the rotation of the substrate W. Its rotation speed is set at about several tens of rpm to several hundred rpm, and is set at 250 rpm in the present preferred embodiment.

Thereafter, the control unit 4 opens the valve 99b, and allows the second gas discharge port 99a of the blocking plate 39 positioned at the proximal position to start the discharge of the nitrogen gas through the second gas supply pipe 99d. DIW that has adhered to the front surface Wf of the substrate W during the rinsing step or moisture in the atmosphere is removed by supplying a nitrogen gas to the front surface Wf of the substrate W that has been blocked from the atmosphere around the substrate W by means of the blocking plate 39, and the atmosphere near the front surface Wf of the substrate W is replaced with a dry atmosphere. In this way, the atmosphere near the front surface Wf of the substrate W, i.e., the atmosphere contiguous to the front surface Wf or contiguous to the liquid film formed on the front surface Wf becomes a dry atmosphere. As a result, it is possible to restrain or prevent a to-be-solidified liquid that is supplied in the following to-be-solidified liquid supplying step from absorbing DIW that has adhered to the front surface Wf of the substrate W or from absorbing moisture in an atmosphere. This makes it possible to prevent a solidification point depression that is caused by such moisture absorption.

Preferably, the nitrogen gas used in the present preferred embodiment is a drying gas whose dew point is 0° C. or less. Although the nitrogen gas is used as a drying inert gas in the present preferred embodiment, gases to be used herein are not limited to the nitrogen gas if these gases are inert with respect to a to-be-solidified liquid. For example, argon gas, helium gas, carbon dioxide gas, or air (gas that has a nitrogen gas concentration of 80% and an oxygen gas concentration of 20%) can be mentioned as another example of the drying inert gas that can be used herein. Alternatively, a gas mixture in which these multiple kinds of gases are mixed together may be used.

Figure 6B:
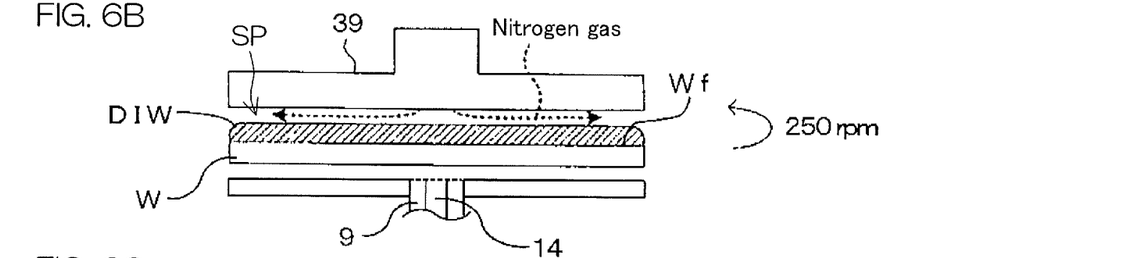

FIG. 6B shows a processing operation of each component and a situation of the substrate W in the atmosphere control step. As shown in FIG. 6B, the gap space SP defined by both the blocking plate 39 positioned at the proximal position and the front surface Wf of the substrate W (liquid-film surface of DIW) is replaced with a dry atmosphere by means of a nitrogen gas supplied by the second gas discharge port 99a.

Next, a fixed time elapses after the atmosphere control step is started, and then the to-be-solidified liquid supplying step of supplying a to-be-solidified liquid to the front surface Wf of the substrate W is performed (step S5 of FIG. 5). The control unit 4 issues an operation command for the spin motor 8 and the blocking-plate rotating unit 422 to increase the rotation speed of the substrate W. Preferably, at this time, the rotation speed of the substrate W is set at such a degree that the film thickness of a liquid film made of tert-butanol serving as a to-be-solidified liquid becomes larger than the height of a protruded pattern portion in the entirety of the front surface Wf, and the rotation speed thereof is set at 400 rpm in the present preferred embodiment.

Thereafter, the control unit 4 opens the valve 97b, and allows the to-be-solidified liquid discharge port 97a of the blocking plate 39 positioned at the proximal position to start the discharge of tert-butanol through the to-be-solidified liquid supply pipe 97d. Tert-butanol that has been supplied to the front surface Wf of the substrate W flows from the vicinity of the center of the front surface Wf of the substrate W toward the peripheral edge portion of the substrate W by means of a centrifugal force caused by the rotation of the substrate W, and diffuses to the entirety of the front surface Wf of the substrate W. Hence, DIW adhering to the front surface Wf of the substrate W is removed by the supply of tert-butanol, and the entirety of the front surface Wf of the substrate W is covered with tert-butanol. Although the atmosphere control step is continuously performed even during the to-be-solidified liquid supplying step in the present preferred embodiment, the present invention is not limited to this. The atmosphere control step may be ended prior to the to-be-solidified liquid supplying step, or may be continuously performed even during a solidification step.

In the to-be-solidified liquid supplying step, tert-butanol is prevented from being solidified before the solidification steps mentioned below by supplying a heat medium, which has been heated to a temperature higher than the solidification point of tert-butanol, to the rear surface of the substrate W. In detail, the control unit 4 opens the valve 9b, and, as a result, a heat medium is supplied from the heat medium supply nozzle 9 to the rear surface of the substrate W. The temperature of the heat medium is merely required to be set so that, in consideration of the thickness of the substrate W and so on, a liquid film of a to-be-solidified liquid formed on the front surface Wf of the substrate W can be controlled to fall within the temperature range that is equal to or more than the melting point of the to-be-solidified liquid and that is less than the boiling point of the to-be-solidified liquid. This makes it possible to prevent the liquid film of the to-be-solidified liquid from being solidified because of vaporization heat generated by the vaporization of the to-be-solidified liquid. Also, no specific limitations are imposed on the amount of supply of the heat medium if it falls within the range within which the heat medium can come into contact with the rear surface of the substrate W. Any liquid or any gas can be arbitrarily set as the heat medium if it is inert with respect to the to-be-solidified liquid.

When a predetermined time elapses after the valve 97b is opened, the control unit 4 closes the valve 97b and the valve 9b, and ends the discharge of tert-butanol from the to-be-solidified liquid discharge port 97a and the supply of the heat medium from the heat medium supply nozzle 9. Hence, the to-be-solidified liquid supplying step is ended. The predetermined time is determined by the amount of supply of tert-butanol. The amount of supply of tert-butanol is not specifically limited, and can be appropriately set correspondingly to the film thickness of the liquid film of tert-butanol formed on the front surface Wf of the substrate W.

Although tert-butanol is used as the to-be-solidified liquid in the present preferred embodiment, the present invention is not limited to this, and ethylene carbonate, acetic acid, 1,1,2,2,3,3,4-heptafluorocyclopentane, cyclohexane, dodecafluorocyclohexane, fluorocarbon compounds, etc., can be mentioned as the to-be-solidified liquid. Preferably, a to-be-solidified liquid whose solidification point is 5° C. to 40° C. is used.

Figure 6C:
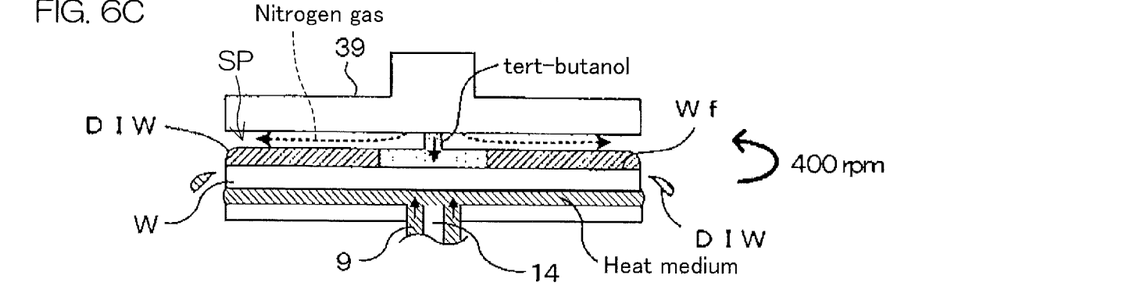

FIG. 6C shows a processing operation of each component and a situation of the substrate W in the to-be-solidified liquid supplying step. As shown in FIG. 6C, a liquid film of tert-butanol is formed while DIW is being removed from the front surface Wf of the substrate W by means of tert-butanol supplied in the to-be-solidified liquid supplying step in the front surface Wf of the substrate W. The atmosphere control step is continuously performed even during the to-be-solidified liquid supplying step. As a result, liquid droplets of DIW are restricted or prevented from again adhering to the liquid film of tert-butanol so as to be dissolved, which is sometimes caused when DIW is removed by tert-butanol. Therefore, this prevents the solidification point depression of tert-butanol caused by the fact that liquid droplets of DIW again adhere thereto and are dissolved.

Thereafter, the solidification step of solidifying a liquid film of tert-butanol formed on the front surface Wf of the substrate W by means of freezing is performed (step S6 of FIG. 5). In detail, the control unit 4 opens the valve 14b, and allows the refrigerant supply nozzle 14 to start the discharge of a refrigerant cooled below the solidification point of tert-butanol toward the rear surface of the substrate W. In consideration of the thickness of the substrate W and so on, the temperature of the refrigerant is merely required to be set at such a temperature that the liquid film of tert-butanol formed on the front surface Wf of the substrate W can be frozen. Also, no specific limitations are imposed on the amount of supply of the refrigerant if it falls within the range within which the refrigerant can come into contact with the rear surface of the substrate Wand if the liquid film of tert-butanol is completely solidified (frozen) with the amount thereof.

Any liquid or any gas can be arbitrarily selected as the refrigerant if it is inert with respect to the to-be-solidified liquid. Additionally, although the to-be-solidified liquid is solidified by supplying the refrigerant to the rear surface of the substrate W in the present preferred embodiment, the solidifying method is not limited to this. For example, the to-be-solidified liquid may be solidified by discharging an inert gas that has been cooled below the solidification point of the to-be-solidified liquid from the first gas discharge port 98a toward the to-be-solidified liquid.

After the liquid film of tert-butanol is completely solidified, the control unit 4 closes the valve 99b, and ends the discharge of the nitrogen gas from the second gas discharge port 99a. Hence, the solidification step and the atmosphere control step are ended. At this time, the refrigerant is continuously supplied from the refrigerant supply nozzle 14.

Although the atmosphere control step is continuously performed even during the to-be-solidified liquid supplying step and the solidification step in the present preferred embodiment, the present invention is not limited to this. The atmosphere control step may be ended prior to the to-be-solidified liquid supplying step, or may be ended prior to the solidification step.

Figure 6D:
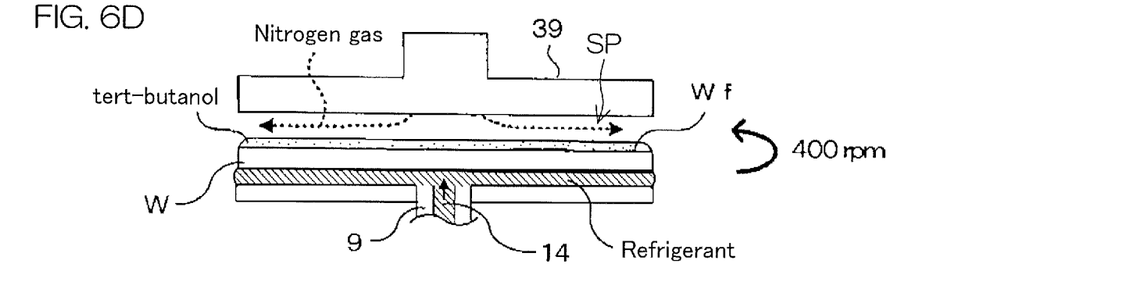

FIG. 6D shows a processing operation of each component and a situation of the substrate W in the solidification step. As shown in FIG. 6D, the liquid film of tert-butanol formed on the front surface Wf of the substrate Win the to-be-solidified liquid supplying step is frozen, and a solidified film is formed. A solidification point depression of tert-butanol, which is caused by the fact that moisture, etc., in the gap space SP dissolve into the liquid film of tert-butanol is prevented by continuously performing the atmosphere control step even during the solidification step.

Next, a removing step is performed in which the solidified film of tert-butanol formed on the front surface Wf of the substrate W is removed from the front surface Wf of the substrate W by means of sublimation (step S7 of FIG. 5). In detail, the control unit 4 opens the valve 98b, and allows the first gas discharge port 98a of the blocking plate 39 positioned at the proximal position to start the discharge of the nitrogen gas through the first gas supply pipe 98d.

In the removing step, the refrigerant is continuously supplied from the refrigerant supply nozzle 14, thus making it possible to maintain tert-butanol so as to have a temperature of its solidification point or less. As a result, it is possible to prevent the solidified film of tert-butanol from melting from the rear surface of the substrate W.

After the solidified film of tert-butanol is removed from the front surface Wf of the substrate W, the control unit 4 closes the valve 14b and the valve 98b, and ends the supply of the refrigerant from the refrigerant supply nozzle 14 and the discharge of the nitrogen gas from the first gas discharge port 98a. Hence, the removing step is ended.

Figure 6E:
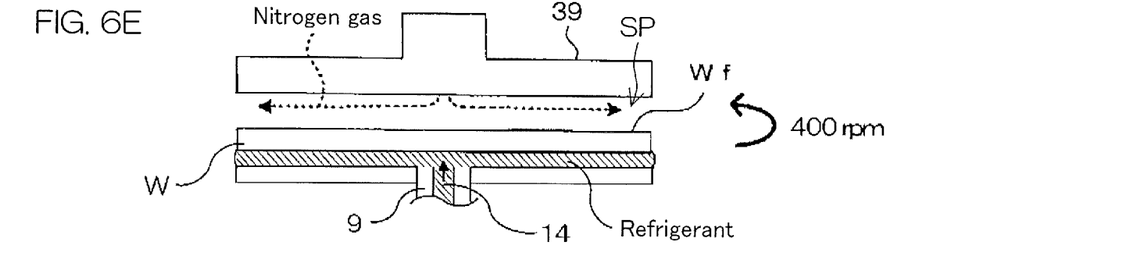

FIG. 6E shows a processing operation of each component and a situation of the substrate W in the removing step. As shown in FIG. 6E, the solidified film of tert-butanol formed on the front surface Wf of the substrate W in the solidification step is sublimated, and hence is removed from the front surface Wf of the substrate W.

Finally, a carrying-out step (step S8 of FIG. 5) of carrying out the substrate W from the processing unit 2 is performed. In detail, the control unit 4 controls the blocking-plate raising/lowering unit 421 so that the blocking plate 39 is raised and positioned at the receded position. Furthermore, a grasp of the substrate W with the plurality of chuck pins 7 is released, and the substrate W is carried out from the processing unit 2 by means of the transfer robot. The series of substrate processing steps are ended with respect to the single substrate W in this way.

As described above, according to the present preferred embodiment, an atmosphere around the front surface Wf of the substrate W is replaced with a dry atmosphere by the atmosphere control step before supplying a to-be-solidified liquid to the front surface Wf of the substrate W. This makes it possible to prevent the solidification point depression of the to-be-solidified liquid that is caused by the fact that the to-be-solidified liquid supplied to the front surface Wf of the substrate W absorbs moisture in the atmosphere around the front surface Wf of the substrate W.

Additionally, it is also possible to prevent the solidification point depression of the to-be-solidified liquid in each step by continuously performing the atmosphere control step during the to-be-solidified liquid supplying step and during the solidification step. Still additionally, in the to-be-solidified liquid supplying step, even if the liquid splash of a rinse liquid (in the present preferred embodiment, DIW) or the like occurs because of the supply of a to-be-solidified liquid, it is possible to restrict the adhesion and dissolution of liquid droplets of a rinse liquid that result therefrom to and into the liquid film of the to-be-solidified liquid. Therefore, it is also possible to prevent the solidification point depression of the to-be-solidified liquid caused by the re-adhesion and dissolution of liquid droplets of the rinse liquid.

The present invention is not limited to the aforementioned preferred embodiment, and can be implemented in various modes besides the aforementioned preferred embodiment unless it departs from its gist. For example, although the description taking the drying treatment as an example is given, the same process may also be performed in the freezing-cleaning treatment.

Figure 7:
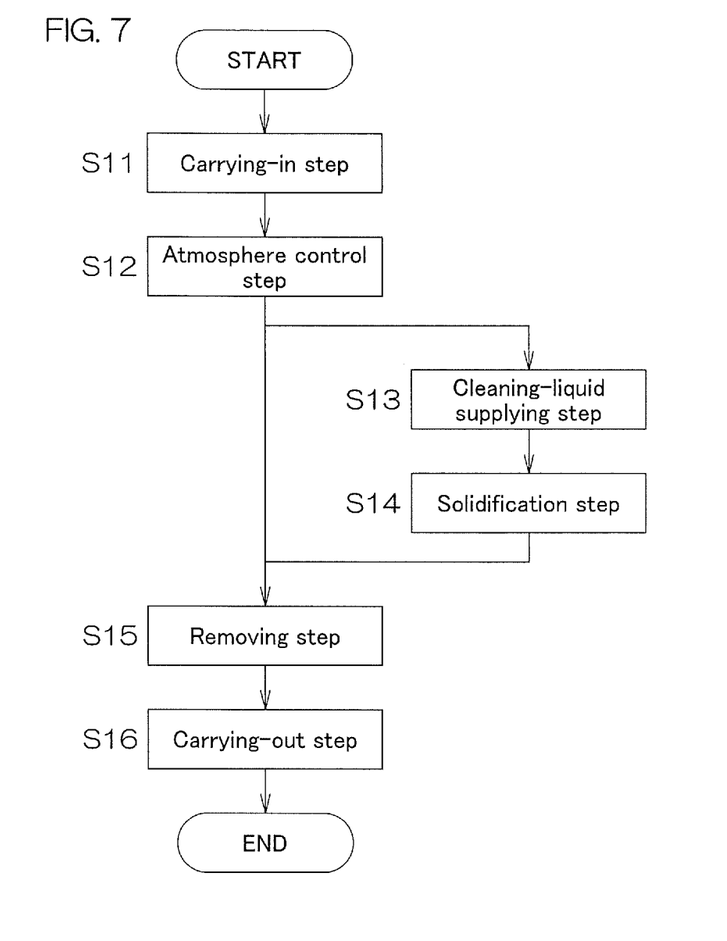
FIG. 7 is a flowchart showing another example of the substrate processing method.

FIG. 7 is a flowchart showing a second operation example of the substrate processing apparatus 1 when the present invention is implemented in the freezing-cleaning treatment. This operation example includes a carrying-in step (step S11), an atmosphere control step (step S12), a cleaning-liquid supplying step (step S13), a solidification step (step S14), a removing step (step S15), and a carrying-out step (step S16).

A difference with the first operation example shown in FIG. 5 is that the to-be-solidified liquid supplying step (step S5) in the first operation example is changed to the cleaning-liquid supplying step (step S13) used for freezing-cleaning treatment. Additionally, the removing step (step S15) in freezing-cleaning treatment melts a solidified film of a cleaning liquid by supplying a heat medium to a front surface or a rear surface of a substrate W, and shakes off the cleaning liquid by increasing the rotation speed of the substrate W. As a result, the cleaning liquid is removed from the front surface Wf of the substrate W. However, in the method of the removing step, dissolution, etc., may be used without being limited to the aforementioned method if the cleaning liquid is removed from the front surface Wf of the substrate W. Additionally, the carrying-out step (step S16) of carrying out the substrate W is not required to be performed immediately after the removing step is ended, and the carrying-out step may be performed after drying treatment is continuously performed.

Additionally, in the first preferred embodiment, a drying inert gas may be configured to be discharged simultaneously with the blocking-plate approaching step although the drying inert gas is discharged in the atmosphere control step after the blocking-plate approaching step is ended.

Still additionally, each processing liquid may be configured to be supplied to the front surface Wf of the substrate W through a nozzle that discharges a processing liquid by disposing the nozzle separately from the blocking plate 39 although each processing liquid is all supplied from each discharge port disposed in the blocking plate 39 in the first preferred embodiment. Still additionally, an inert gas stream with which a space above the substrate W is covered may be formed instead of the use of the blocking plate 39 so that the atmosphere above the substrate W is limited. This inert gas stream can be formed by using a gas discharge nozzle that is a component described in, for example, Japanese Patent Application Publication No. 2013-201334. While preferred embodiments of the present invention have been described in detail above, these are merely specific examples used to clarify the technical content of the present invention, and the present invention should not be interpreted as being limited to these specific examples, and the scope of the present invention shall be limited only by the appended claims.

REFERENCE SIGNS LIST

1 Substrate processing apparatus
2 Processing unit
3 Chamber
4 Control unit
5 Spin chuck
8 Spin motor
9 Heat medium supply nozzle
14 Refrigerant supply nozzle
37 Cup
38 Cup raising/lowering unit
39 Blocking plate
40 Discharge port
41 Rotation support shaft
42 Support arm
96 Rinse liquid supply passage
97 To-be-solidified liquid supply passage
98 First gas supply passage
99 Second gas supply passage 421 Blocking-plate raising/lowering unit
422 Blocking-plate rotating unit
A1 Rotational axis

The invention claimed is:

1. A substrate processing method, comprising:
an atmosphere control step of supplying a drying gas to a front surface of a substrate on which a pattern has been formed and making a dry atmosphere around the front surface of the substrate;
a to-be-solidified liquid supplying step of supplying a to-be-solidified liquid to the front surface of the substrate; and
a solidification step of forming a solidified mass by solidifying a liquid film of the to-be-solidified liquid,
wherein the atmosphere control step is started before the liquid film of the to-be-solidified liquid supplied to the front surface of the substrate in the to-be-solidified liquid supplying step is formed, and
a solidification point of the to-be-solidified liquid is 5° C. to 40° C.

2. The substrate processing method according to claim 1, wherein the atmosphere control step is started before the to-be-solidified liquid supplying step is started.

3. The substrate processing method according to claim 1, wherein the atmosphere control step is ended while the to-be-solidified liquid supplying step is being performed, or when the to-be-solidified liquid supplying step is ended, or after the to-be-solidified liquid supplying step is ended.

4. The substrate processing method according to claim 1, further comprising a shielding-plate approaching step of causing a shielding plate to relatively approach the substrate, the shielding plate being disposed to face the substrate and having a substantially flat surface that faces the front surface of the substrate,
wherein the shielding-plate approaching step is performed before the atmosphere control step is started.

5. The substrate processing method according to claim 4, wherein a distance between the substrate and the shielding plate is always constant at least until the to-be-solidified liquid supplying step is completed after the shielding-plate approaching step is completed.

6. The substrate processing method according to claim 5, wherein the distance between the substrate and the shielding plate is always constant until the solidification step is completed after the shielding-plate approaching step is completed.

7. The substrate processing method according to claim 1, further comprising a removing step of removing the to-be-solidified liquid that has been solidified from the substrate after the solidification step is completed.

8. A substrate processing apparatus comprising:
a substrate holder that rotates while holding a substrate;
a first gas supply that supplies a drying gas to a front surface of the substrate held by the substrate holder;
a to-be-solidified liquid supply that supplies a to-be-solidified liquid, having a solidification point in a range from 5° C. to 40° C., to the front surface of the substrate held by the substrate holder; and
a solidifier that solidifies the to-be-solidified liquid,
wherein the to-be-solidified liquid supplied to the front surface of the substrate by the to-be-solidified liquid supply forms a liquid film by rotation of the substrate holder, and
wherein the liquid film is formed in a state in which a dry atmosphere has been made around the front surface of the substrate.

9. The substrate processing apparatus according to claim 8, further comprising a shielding plate that is disposed to face the substrate held by the substrate holder and that has a substantially flat surface that faces the substrate.

10. The substrate processing apparatus according to claim 8, further comprising a remover that removes the to-be-solidified liquid that has been solidified from the substrate.

* * * * *